US010672746B2

(12) United States Patent
Lo Verde et al.

(10) Patent No.: US 10,672,746 B2
(45) Date of Patent: Jun. 2, 2020

(54) INTEGRATED CIRCUIT FORMED FROM A STACK OF TWO SERIES-CONNECTED CHIPS

(71) Applicant: Exagan, Grenoble (FR)

(72) Inventors: Domenico Lo Verde, Heitersheim (DE); Laurent Guillot, Seysses (FR); Fabrice Letertre, Grenoble (FR)

(73) Assignee: Exagan, Grenoble (FR)

( * ) Notice: Subject to any disclaimer, the term of this patent is extended or adjusted under 35 U.S.C. 154(b) by 0 days.

(21) Appl. No.: 16/463,809

(22) PCT Filed: Nov. 20, 2017

(86) PCT No.: PCT/FR2017/053169

§ 371 (c)(1),
(2) Date: May 23, 2019

(87) PCT Pub. No.: WO2018/096245

PCT Pub. Date: May 31, 2018

(65) Prior Publication Data

US 2019/0378823 A1 Dec. 12, 2019

(30) Foreign Application Priority Data

Nov. 23, 2016 (FR) ..................................... 16 61379

(51) Int. Cl.
*H01L 25/07* (2006.01)
*H01L 25/18* (2006.01)
*H01L 23/00* (2006.01)

(52) U.S. Cl.
CPC ............ *H01L 25/074* (2013.01); *H01L 24/08* (2013.01); *H01L 24/40* (2013.01); *H01L 24/48* (2013.01);

(Continued)

(58) Field of Classification Search
CPC ....... H01L 25/074; H01L 24/08; H01L 24/40; H01L 24/48; H01L 25/18;

(Continued)

(56) References Cited

U.S. PATENT DOCUMENTS

2012/0199875 A1* 8/2012 Bhalla ................ H01L 27/0629 257/134
2012/0256189 A1* 10/2012 McDonald ........... H01L 25/074 257/76
2016/0190114 A1* 6/2016 Huang ................... H01L 25/18 257/76

FOREIGN PATENT DOCUMENTS

EP 2511952 A1 10/2012
JP 2013-222905 A 10/2013

OTHER PUBLICATIONS

International Search Report for International Application No. PCT/FR2017/053169 dated Mar. 5, 2018, 6 pages.

(Continued)

*Primary Examiner* — Victor A Mandala
(74) *Attorney, Agent, or Firm* — TraskBritt

(57) ABSTRACT

An integrated circuit includes a first chip including a high-voltage depletion-mode transistor and a second chip including an enhancement-mode device. The chips have first and second gate contact pads, first and second source contact pads and first and second drain contact pads, respectively, on their front sides. Chips are joined together via their front sides, and the area of the first chip is larger than that of the second chip. The first chip includes an additional contact pad on its front side that is electrically insulated from the high-voltage depletion-mode transistor and that contacts the second gate contact pad. The first gate contact pad contacts the second source contact pad and/or the first source contact pad contacts the second drain contact pad. The first gate (Continued)

contact pad and the additional contact pad extend at least partially into a peripheral portion of the first chip.

21 Claims, 6 Drawing Sheets

(52) U.S. Cl.
CPC .... *H01L 25/18* (2013.01); *H01L 2224/08145* (2013.01); *H01L 2224/40145* (2013.01); *H01L 2224/48145* (2013.01); *H01L 2924/1033* (2013.01); *H01L 2924/10253* (2013.01); *H01L 2924/13064* (2013.01); *H01L 2924/13091* (2013.01)

(58) Field of Classification Search
CPC . H01L 2224/08145; H01L 2224/40145; H01L 2224/48145; H01L 2924/10253; H01L 2924/1033; H01L 2924/13064; H01L 2924/13091; H01L 2224/0603; H01L 2224/16145; H01L 2224/48247; H01L 2224/48257; H01L 2224/49113; H01L 2224/73257; H01L 23/49844; H01L 23/49562; H01L 23/49575
See application file for complete search history.

(56) References Cited

OTHER PUBLICATIONS

International Search Report for International Application No. PCT/FR2017/053169 dated Mar. 5, 2018, 2 pages.

* cited by examiner

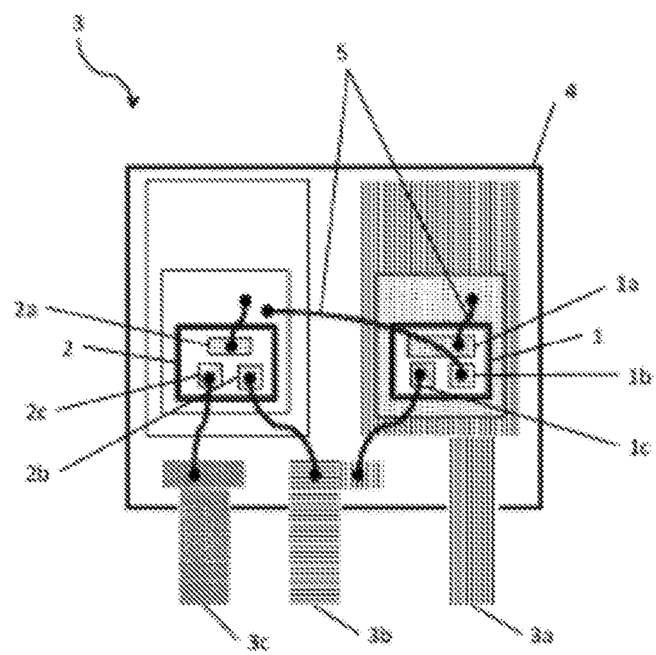
FIG. 1 State of the Art
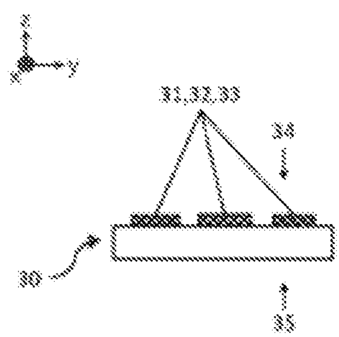
FIG.2a
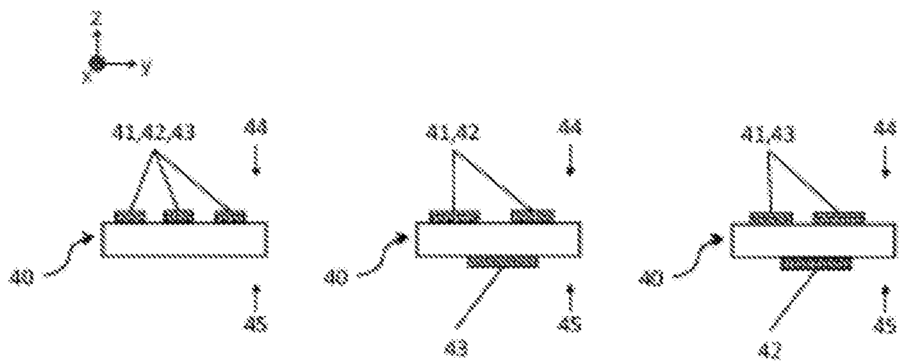
FIG.2b

INTEGRATED CIRCUIT FORMED FROM A STACK OF TWO SERIES-CONNECTED CHIPS

CROSS-REFERENCE TO RELATED APPLICATIONS

This application is a national phase entry under 35 U.S.C. § 371 of International Patent Application PCT/FR2017/053169, filed Nov. 20, 2017, designating the United States of America and published as International Patent Publication WO 2018/096245 A1 on May 31, 2018, which claims the benefit under Article 8 of the Patent Cooperation Treaty to French Patent Application Serial No. 1661379, filed Nov. 23, 2016.

TECHNICAL FIELD

This disclosure relates to an integrated circuit comprising a stack of a chip including an enhancement mode transistor on a chip including a high voltage depletion-mode transistor, both chips being connected in series.

BACKGROUND

HEMT transistors (High Electron Mobility Transistors) made of III-N semiconductor materials are conventionally "normally on," i.e., they have a negative threshold voltage and can conduct current with a gate voltage of OV. These components with negative threshold voltages are called depletion mode (or "D-Mode") components.

It is preferable for power electronics applications to have so-called "normally off" components, i.e., to have a positive threshold voltage, which, therefore, cannot conduct current when the gate voltage is OV. These components are currently called enhancement mode ("E-mode") components.

The manufacture of high voltage E-mode components on III-N semiconductor materials is complex. An alternative to a simple high voltage E-mode component is to combine a high voltage D-mode component with an E-mode, for example, low voltage component. Advantageously, the high voltage transistor is a HEMT transistor made of III-N semiconductor materials and the low voltage transistor is a MOSFET (Metal Oxide Semiconductor Field Effect Transistor) made of silicon.

For example, as shown in FIG. 1, chips 1, 2 comprising D-mode HEMT and MOSFET components respectively can be coupled to form a cascode-type integrated circuit 3: the drain 2*a* and the source 2*b* of the E-mode MOSFET chip 2 are respectively connected to the source 1*b* and the gate 1*c* of the HEMT D-mode chip 1; this electrical connection is provided in the housing 4 of the integrated circuit 3 including the two electronic chips 1, 2, usually by wire bonding 5 between different contact pads of the gate 1*c*, 2*c*, source 1*b*, 2*b* and drain 1*a*, 2*a* accessible on each of the chips 1, 2. In the integrated cascode circuit 3, the gate 2*c* of the MOSFET chip 2 controls the setting of the ON mode or the OFF mode of the integrated circuit 3.

The gate contact pad 2*c* of the MOSFET chip 2 is connected in the housing 4 of the integrated circuit 3 to a gate pin 3*c*. The source contact pad 2*b* of the MOSFET chip 2 is connected in the housing 4 to a source pin 3*b*. Eventually, the drain contact pad of the HEMT chip 1 is connected, still in the housing 4, to a drain pin 3*a*. Usually, the connections between the contact pads of the chips and the pins are provided by wire connection 5 or using electrical connection clips. The three pins 3*a*, 3*b*, 3*c* provide the electrical connections of the integrated circuit 3 outside the housing 4.

In a cascode-type integrated circuit, while fast switching is one of the expected benefits of a HEMT chip, interconnections (including wired connections) between the different components limit the switching speed. Indeed, the interconnections create parasitic overvoltages or undervoltages that can damage the different transistors during each switching. It is, therefore, necessary to reduce the switching edges (switching speed) to limit these excursions in parasitic voltage. To access high switching speeds, it is, therefore, necessary to minimize the inductances and parasitic resistances associated with interconnections in a cascode arrangement.

In addition, the fact that the two chips are side by side in the housing requires the use of an interconnection substrate (for example, DBC for "Direct bonded copper") and increases the necessary lateral dimensions of the housing.

U.S. Pat. No. 8,847,408 presents a cascode-integrated circuit without an interconnection substrate comprising a first III-N transistor on which a second MOSFET transistor is stacked; the back side of the MOSFET transistor, which includes the drain contact pad of the MOSFET, is assembled on the source contact pad of the III-N transistor, on the front side of the latter. Although reducing the necessary lateral dimensions of the housing, this configuration has some disadvantages. In particular, the presence of inductances and parasitic resistances related to the electrical connections between the gate contact pad, the MOSFET source pads and the associated pins.

BRIEF SUMMARY

One aim of the present disclosure is to provide an alternative solution to the solutions of the prior art. An object of the disclosure is, in particular, to propose an integrated circuit comprising a stack of a chip comprising an enhancement mode device on a chip comprising a high voltage depletion-mode transistor, wherein the inductances and parasitic resistances linked to the interconnections are reduced.

This disclosure relates to an integrated circuit comprising a first chip having a high-voltage depletion-mode transistor and a second chip having an enhancement mode device; the first chip comprises, on a front side, first gate, source and drain contact pads and the second chip comprises second gate, source and drain contact pads.

The substrate is notable in that:

The first and second chips are joined to each other at their respective front faces and form a stack, the surface of the front side of the first chip being larger than that of the second chip so that a peripheral portion of the front side of the first chip is not masked by the second chip, The first chip has at least one additional contact pad arranged on its front side, electrically insulated from the high voltage depletion-mode transistor, and in contact with the second gate contact pad, The first gate contact pad is in contact with the second source contact pad and/or the first source contact pad is in contact with the second drain contact pad, The first gate contact pad and the additional contact pad extend at least partially into the peripheral portion of the first chip.

According to other advantageous and unrestrictive characteristics of the disclosure, taken alone or in any technically feasible combination:

the integrated circuit comprises a housing comprising at least three electrical terminals, a gate terminal, a source terminal and a drain terminal, and wherein the stack is arranged, the rear side of the first chip being arranged on a structural plate of the housing connected to the source terminal;

the first gate contact pad, in contact with the second source contact pad, extends over an active region of the transistor of the first chip and forms the main assembly surface between the first chip and the second chip;

the second drain contact pad, on the rear side of the second chip, is connected to the first source contact pad located in the peripheral portion, by means of an electrical connection clip;

the first source contact pad, in contact with the second drain contact pad, extends over an active region of the transistor of the first chip and forms the main assembly surface between the first chip and the second chip;

the second source contact pad, on the rear side of the second chip, is connected to the first gate contact pad by means of an electrical connection clip;

the first source contact pad, in contact with the second drain contact pad, extends over an active region of the transistor of the first chip and forms the main assembly surface between the first chip and the second chip;

the second source contact pad, on the front side of the second chip, is in contact with the first gate contact pad;

the additional contact pad, the first gate contact pad and the first drain contact pad are connected to the gate terminal, the source terminal and the drain terminal respectively;

at least the connection between the first gate contact pad and the source terminal, and the connection between the first drain contact pad and the drain terminal are provided by means of electrical connection clips;

the connection between the first gate contact pad and the source terminal is provided by means of an electrical connection clip between the structural plate of the housing and the first gate contact pad, the source terminal being electrically connected to the structural plate;

the connection between the additional contact pad and the gate terminal is provided by means of a wire connection or an electrical connection clip;

the integrated circuit comprises a housing comprising at least four electrical terminals, a gate terminal, a source terminal, a drain terminal and an additional gate terminal, and wherein the stack is arranged, the rear side of the first chip being arranged on a structural plate of the housing connected to the source terminal;

the first chip has a supplementary additional contact pad placed on its front side, electrically insulated from the high-voltage depletion-mode transistor, and extending at least partially into the peripheral portion of the first chip;

the first source contact pad, in contact with the second drain contact pad, extends over an active region of the transistor of the first chip and forms the main assembly surface between the first chip and the second chip;

the second source contact pad, on the front side of the second chip, is in contact with the supplementary additional contact pad;

the additional contact pad, the supplementary additional contact pad, the first drain contact pad and the first gate contact pad are connected to the gate terminal, the source terminal, the drain terminal and the additional gate terminal respectively;

at least the connection between the supplementary additional contact pad and the source terminal, and the connection between the first drain contact pad and the drain terminal are made by means of electrical connection clips;

the connection between the supplementary additional contact pad and the source terminal is provided by means of an electrical connection clip between the structural plate of the housing and the supplementary additional contact pad, the source terminal being electrically connected to the structural plate;

the connection between the additional contact pad and the gate terminal, and the connection between the first gate contact pad and the additional gate terminal are provided by means of wire connections or electrical connection clips;

the first and second chips are joined to each other, at their respective front faces, by welding the contact pads facing each other;

the rear side of the first chip has a conductive block assembled by welding on the structural plate of the housing;

the enhancement mode device included in the second chip includes an enhancement mode transistor with a gate electrode connected to the gate contact pad of the second chip;

the enhancement mode device included in the second chip comprises an enhancement mode transistor and a control component, a gate electrode of the enhancement mode transistor being connected to an input of the control component and an output of the control component being connected to the gate contact pad of the second chip.

BRIEF DESCRIPTION OF THE DRAWINGS

Other characteristics and advantages of the disclosure will emerge from the detailed description hereunder while referring to the accompanying figures, wherein:

FIG. 1 shows a circuit integrated in a housing according to the state of the art;

FIGS. 2*a* to 2*d* show elements of the integrated circuit according to the disclosure;

DETAILED DESCRIPTION

Figure 2C:
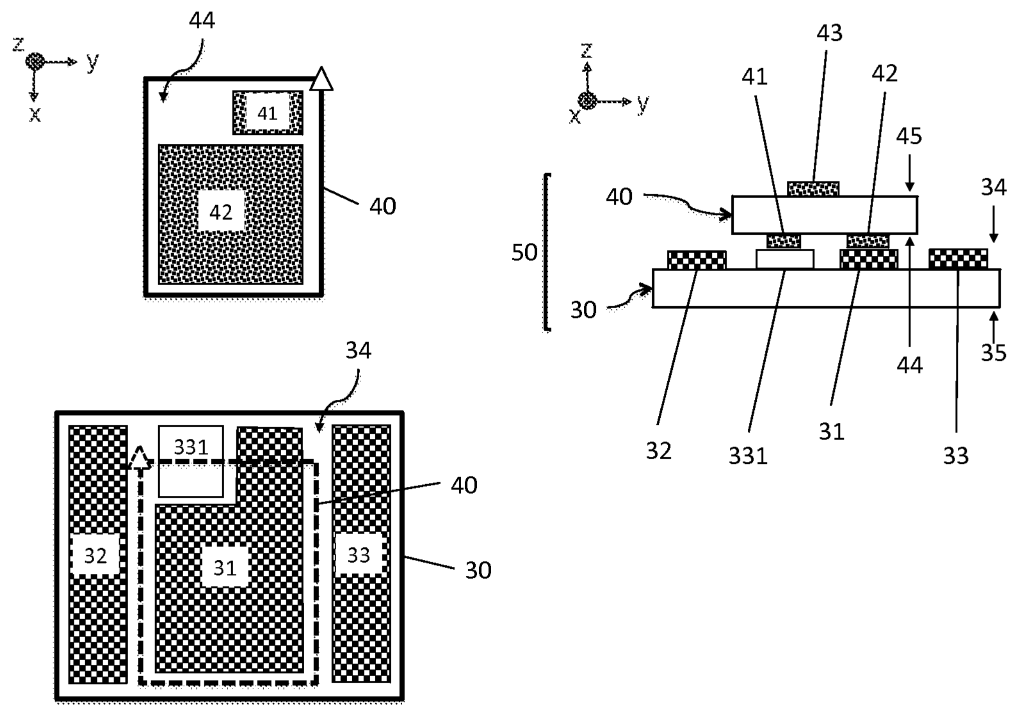

In the descriptive part, the same references in the figures can be used for elements of the same type.

The figures are schematic representations that, for the sake of clarity, are not to scale. In particular, the thicknesses of the layers according to the Z axis are not to scale relative to the lateral dimensions according to the X and Y axes. In addition, to allow easier visualization of the connections in the integrated circuit according to the disclosure, the cross-sectional views may in some cases show elements included in several different vertical planes (planes (y, z) in the figures).

Of course, the schematic representations of the figures do not limit in any way the configurations and positioning of the elements of the integrated circuit according to the disclosure.

The disclosure relates to an integrated circuit 100 comprising a first chip 30 comprising a high voltage depletion-mode (D-mode) transistor and a second chip 40 comprising an enhancement mode (E-mode) device. For example, the high voltage depletion-mode transistor may consist of a GaN-based HEMT transistor. The enhancement mode device may consist of a silicon-based MOS field effect (MOSFET) transistor; it may also consist of a device comprising a MOSFET coupled with a control component (driver).

The first chip 30 has, on a front side 34, first gate 31, source 32 and drain 33 contact pads (FIG. 2*a*). The second chip 40 has second gate 41, source 42 and drain 43 contact pads (FIG. 2*b*). According to the embodiments of the disclosure, all three second contact pads 41, 42, 43 may be located on the front side 44 of the second chip 40, or one of the second drain 43 or source 42 contact pads may be located on the rear side 45 of the second chip 40.

As is well known to the skilled person, the contact pads are made of an electrically conductive metallic material, such as copper, aluminum, nickel or any other suitable material. In particular, the metallic material forming the contact pads is suitable for assembling or welding. The contact pads of a chip, according to the disclosure, may take different forms: either blocks in relief with respect to the surface of the front side of the chip, or beads ("bumps") also in relief with respect to the surface of the front side of the chip. The arrangement and the lateral dimensions (in plane (x, y)) of the first 31, 32, 33 and second 41, 42, 43 contact pads on the respective front sides 34, 44 of the first 30 and second 40 chips or the rear side 45 of the second chip 40 may be different, depending on the production methods and variants in accordance with the disclosure.

In the integrated circuit 100 according to the disclosure, the first chip 30 and the second chip 40 are joined to each other at their respective front sides 34, 44 and form a stack 50 (FIG. 2*c*). The surface of the front side 34 of the first chip 30 is larger than that of the second chip 40 so that a peripheral portion of the front side 34 of the first chip 30 is not masked by the second chip 40: this peripheral portion is, for example, illustrated on the plan view in (x, y) in FIG. 2*c*, it is the part outside the dotted outline corresponding to the second chip 40. It should be noted that the plan view on FIG. 2*c* shows a view of the second chip 40 not assembled, with its front side 44 upwards, for a better visualization of the arrangement of the second contact pads on its front side 44. In the stack 50, it is flipped over, with its front side 44 facing the front side 34 of the first chip. On the plan view representing the first chip 30, the inverted second chip 40 is illustrated by the dotted outline; the triangular mark on the outline of the second chip 40 makes it possible to understand the positioning of the second contact points located on the front side 44, in the stack 50.

In addition to the first contact pads 31, 32, 33 previously mentioned, the first chip 30 has at least one additional contact pad 331 arranged on its front side 34. The additional contact pad 331 is electrically insulated from the high voltage depletion-mode transistor of the first chip 30. Like other contact pads, it is made of an electrically conductive metallic material that can be assembled or welded to another facing contact pad.

In particular, according to the disclosure, the additional contact pad 331 is in contact with the second gate contact pad 41. The assembly for contacting the additional contact pad 331 and the second gate contact pad 41 can be carried out by a metal bonding method, for example, by thermo-compression or a welding or brazing method between the materials composing the contact pads facing each other. This makes it possible to obtain a good quality electrical contact between the additional contact pad 331 and the second gate contact pad 41, with a significantly reduced conduction path, especially compared to wired connections.

According to the disclosure, the additional contact pad 331 extends at least partially into the peripheral portion of the first chip 30. It also extends, of course, into the portion that will be hidden by the second chip 40, so that it faces the second gate contact pad 41 of the second chip 40 in the stack 50.

According to the disclosure, the first gate contact pad 31 also extends, at least in part, into the peripheral portion of the first chip 30.

According to the embodiments and variants detailed below, the assembly of the front sides 34, 44 of the first 30 and second 40 chips may lead either to the contact of the first gate contact pad 31 with the second source contact pad 42, or to the contact of the first source contact pad 32 with the second drain contact pad 43, or to the two above-mentioned contacts.

Figure 2D:
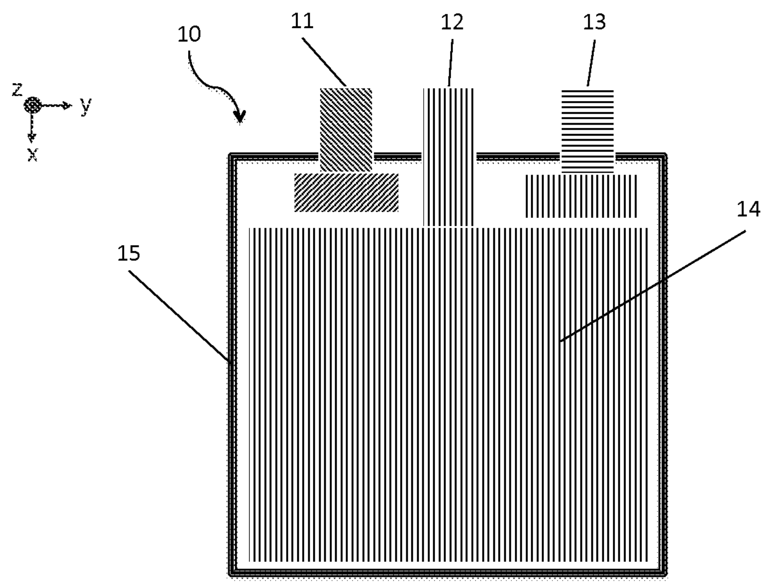

Advantageously, the integrated circuit 100 includes a housing 10, an insulating portion 15 of which intended to encapsulate the electronic components of the integrated circuit 100 is formed by an electrical insulating material, typically resin. The housing 10 has at least three electrical terminals, one gate terminal 11, one source terminal 12 and one drain terminal 13, as shown in FIG. 2*d*. An electrical terminal specifically means a pin (as shown in FIG. 2*d*) or a metal pad or other means to form an external electrical contact of the integrated circuit 100: this external contact can then be connected to other elements, for example, on a printed circuit.

The housing 10 also has a conductive structural plate 14. The structural plate 14 is intended to support the electronic components of the integrated circuit 100. The structural plate 14 is connected to one of the three electrical terminals 11, 12, 13; in the case shown in FIG. 2*d*, the structural plate 14 is connected to the source terminal 12. In this description, "connected" means electrically connected: either directly, i.e., by direct contact between the two connected elements, or indirectly, i.e., by means of an intermediate element, itself in contact with the electrically connected elements; the intermediate element may, for example, be an electrical connection clip or one or more wire connection(s). The structural plate 14 is usually encapsulated, as are the electronic components of the integrated circuit 100, in the insulating portion 15 of the housing 10.

The stack 50 is placed on the structural plate 14; in particular, the rear side 35 of the first chip 30 is placed on the structural plate 14 of the housing 10 connected to the source terminal 12. For example, the rear side 35 of the first chip 30 may have a conductive block in direct contact or assembled with an electrically conductive material on the structural plate 14. According to another example, the rear side 35 of the first chip 30 can be assembled using an electrically conductive adhesive material on the structural plate 14.

The electrical connections between the two chips 30, 40 of the integrated circuit 100 according to the disclosure have significantly shorter lengths due to the direct contact provided in the stack 50. In addition, the presence of the additional contact pad 331 on the front side 34 of the first chip 30, also allows the second gate contact pad 41 of the second chip 40 to be effectively connected and made accessible on the front side 34 of the first chip 30, for connection to the gate terminal 11 of the housing 10. This results in a significant reduction of parasitic resistances and inductances at the concerned connection nodes.

The stack 50 of the integrated circuit 100 according to the disclosure also has the advantage of occupying a reduced space with lateral dimensions limited to the dimensions of the first chip 30. Finally, the configuration of the stack 50 makes it possible not to use an interconnection substrate, usually used to support and connect the two chips together.

According to a first embodiment of the disclosure, the housing 10 includes three electrical terminals 11, 12, 13. The stack 50 of the integrated circuit 100 is as shown in FIGS. 3*a* and 3*b*.

The first gate contact pad 31, in contact with the second source contact pad 42, extends over an active region of the transistor of the first chip 30, which makes it possible to take advantage of a necessarily present surface of the transistor (active region) and thus to limit the extent of the contact pads on non-active regions of the transistor. It should be noted that the active region of the high voltage depletion-mode transistor corresponds to the region between the source electrode and the drain electrode of the transistor, containing the current conduction channel.

The first gate contact pad 31 forms the main assembly surface between the first chip 30 and the second chip 40. The main assembly surface is defined as the largest surface on the front side 34 of the first chip 30, which will be used, in addition to establishing electrical contact between the opposing contact pads, to ensure mechanical resistance between the two chips 30, 40. The second source contact pad 42 also has an extended surface on the front side 44 of the second chip 40, which is in contact with the first gate contact pad 31.

Figure 3A:
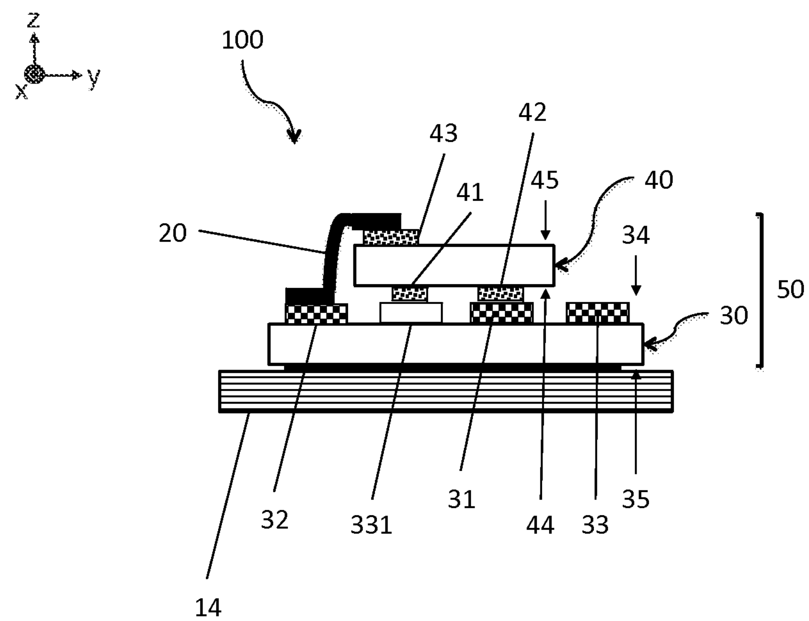
FIGS. 3*a* and 3*b* respectively show a cross-sectional view and a plan view of an integrated circuit according to a first embodiment of the disclosure.
Figure 3B:
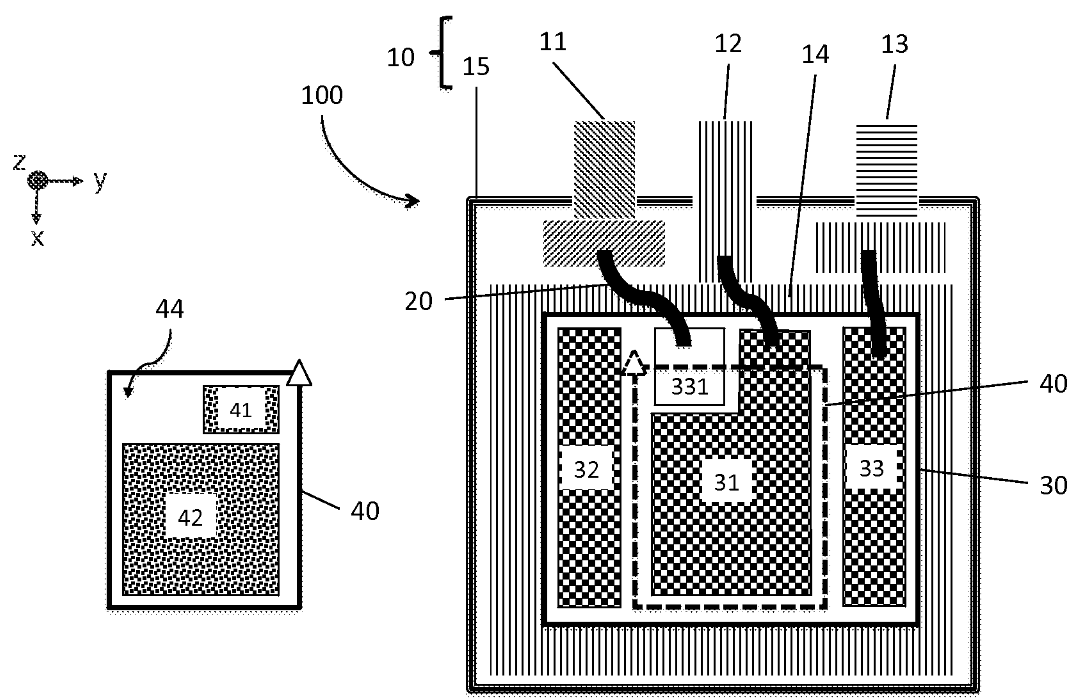

Advantageously, the second drain contact pad 43, on the rear side 45 of the second chip 40, is connected to the first source contact pad 32 located in the peripheral portion of the first chip 30, by means of an electrical connection clip 20 (FIG. 3*a*).

Finally, the additional contact pad 331, the first gate contact pad 31 and the first drain contact pad 33 are connected to the gate terminal 11, the source terminal 12 and the drain terminal 13, respectively, as shown in FIG. 3*b*. Preferably, at least the connection between the first gate contact pad 31 and the source terminal 12, and the connection between the first drain contact pad 33 and the drain terminal 13 are provided by means of electrical connection clips 20. According to a variant (not shown), the connection between the first gate contact pad 31 and the source terminal 12 is provided by means of an electrical connection clip 20 between the structural plate 14 of the housing 10 and the first gate contact pad 31, the source terminal 12 being electrically connected to the structural plate 14.

The connection between the additional contact pad 331 and the gate terminal 11 can be provided by means of a wire connection or an electrical connection clip 20.

According to this first embodiment of the disclosure, an integrated circuit 100 is obtained, the first 30 and second 40 chips of which are connected in a cascode arrangement and wherein the parasitic resistances and inductances related to the electrical connections between the different components and elements of the integrated circuit 100 are reduced due to the greatly reduced connection paths and the preferential use of electrical connection clips instead of wire connections on the current paths of the circuit 100.

Figure 4A:
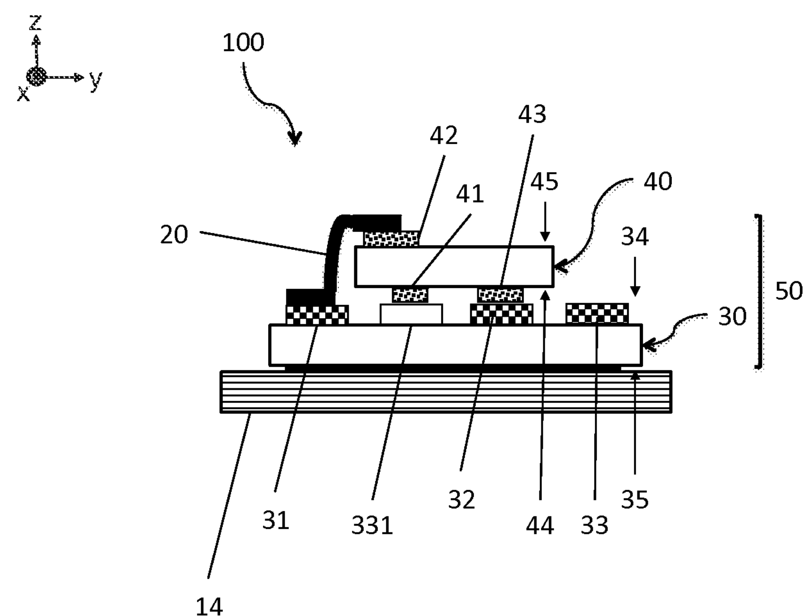
FIGS. 4*a* and 4*b* respectively show a cross-sectional view and a plan view of an integrated circuit according to a second embodiment of the disclosure.
Figure 4B:
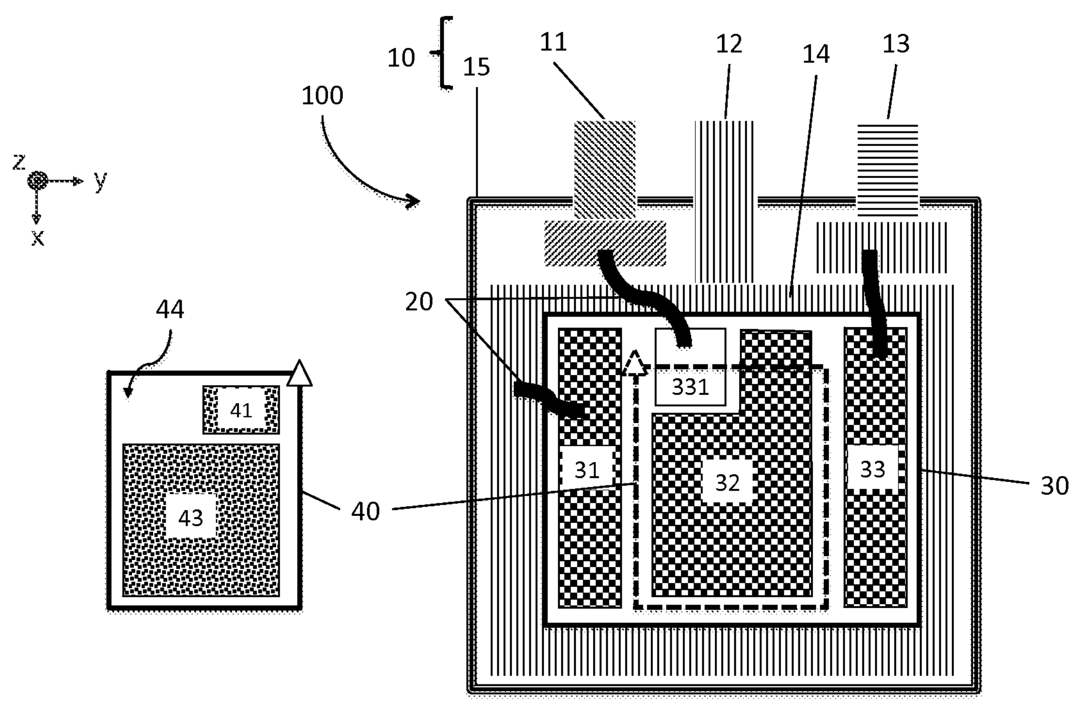

According to a second embodiment of the disclosure, the housing 10 also includes three electrical terminals 11, 12, 13 and the stack 50 of the integrated circuit 100 is as shown in FIGS. 4*a* and 4*b*.

The first source contact pad 32 is in contact with the second drain contact pad 43, it extends over the active transistor region of the first chip 30 and forms the main assembly surface between the first chip 30 and the second chip 40. The second drain contact pad 43 also has an extended surface on the front side 44 of the second chip 40, which will make contact with the first source contact pad 32.

Advantageously, the second source contact pad 42, on the rear side 45 of the second chip 40, is connected to the first gate contact pad 31 by means of an electrical connection clip 20.

Finally, the additional contact pad 331, the first gate contact pad 31 and the first drain contact pad 33 are connected to the gate terminal 11, the source terminal 12 and the drain terminal 13, respectively, as shown in FIG. 4*b*. Preferably, at least the connection between the first gate contact pad 31 and the source terminal 12, and the connection between the first drain contact pad 33 and the drain terminal 13 are provided by means of electrical connection clips 20. As shown in FIG. 4*b*, the connection between the first gate contact pad 31 and the source terminal 12 can be provided by means of an electrical connection clip 20 between the structural plate 14 of the housing 10 and the first gate contact pad 31, the source terminal 12 being electrically connected to the structural plate 14.

The connection between the additional contact pad 331 and the gate terminal 11 can be provided by means of a wire connection or an electrical connection clip 20.

According to this second embodiment of the disclosure, an integrated circuit 100 is obtained, the first 30 and second 40 chips of which are connected in a cascode arrangement and wherein the parasitic resistances and inductances linked to the electrical connections between the various components and elements of the integrated circuit 100 are greatly reduced compared to state-of-the-art solutions.

Figure 5A:
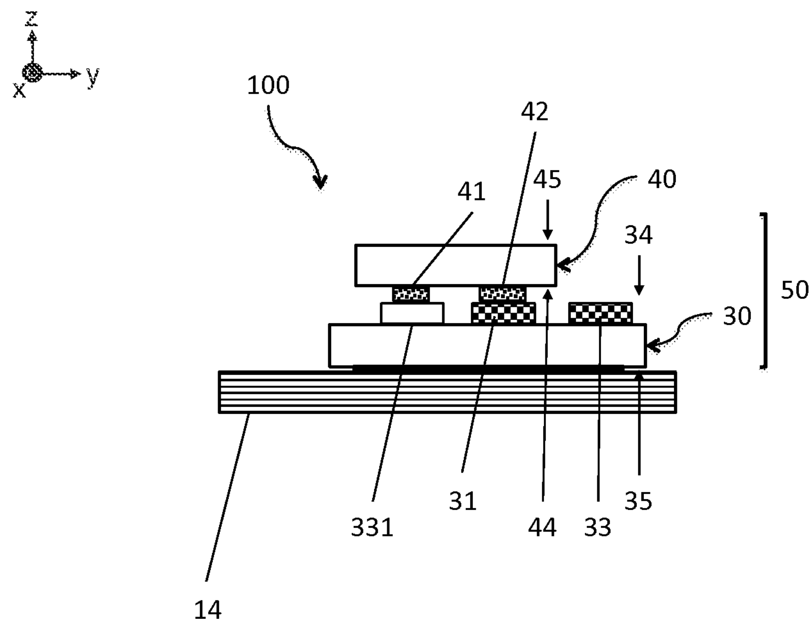
FIGS. 5*a* and 5*b* respectively show a cross-sectional view and a plan view of an integrated circuit according to a third embodiment of the disclosure.
Figure 5B:
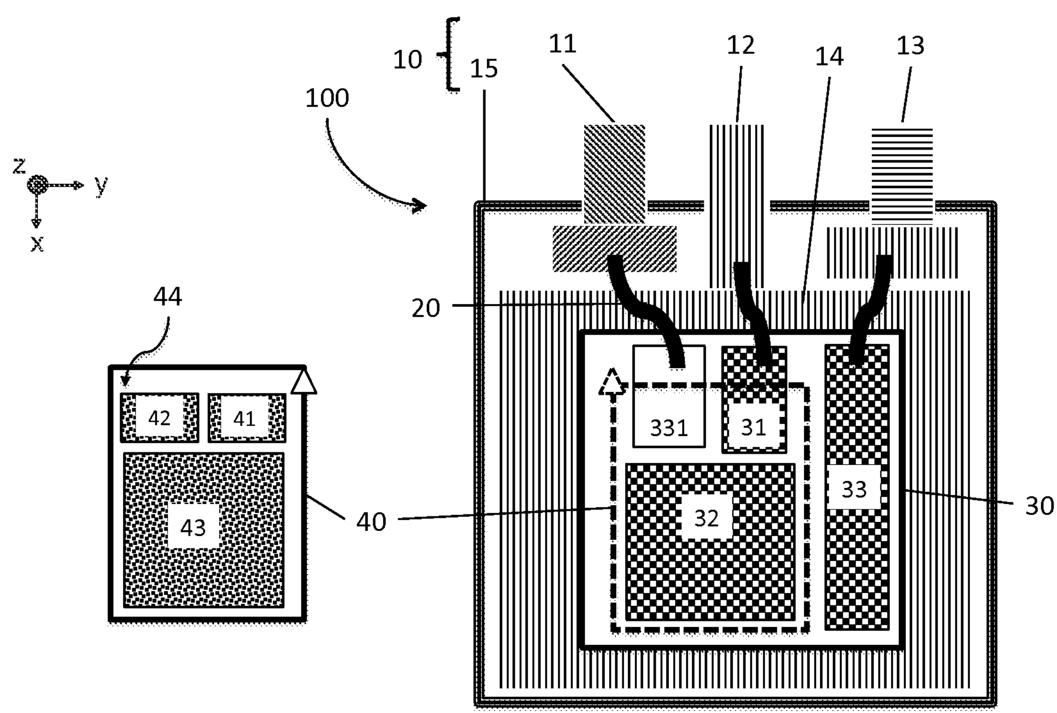

According to a third embodiment of the disclosure, the housing 10 also includes three electrical terminals 11, 12, 13 and the stack 50 of the integrated circuit 100 is as shown in FIGS. 5*a* and 5*b*. The second gate 41, source 42 and drain 43 contact pads are located on the front side 44 of the second chip 40 (FIG. 5*b*).

The first source contact pad 32 is in contact with the second drain contact pad 43; it extends over an active region of the transistor of the first chip 30 and forms the main assembly surface between the first chip 30 and the second chip 40. The second drain contact pad 43 also has an extended surface on the front side 44 of the second chip 40, which will make contact with the first source contact pad 32.

Advantageously, the second source contact pad 42, on the front side 44 of the second chip 40, is in contact with the first gate contact pad 31 (FIG. 5*a*).

Finally, the additional contact pad 331, the first gate contact pad 31 and the first drain contact pad 33 are connected to the gate terminal 11, the source terminal 12 and the drain terminal 13, respectively, as shown in FIG. 5*b*. Preferably, at least the connection between the first gate contact pad 31 and the source terminal 12, and the connection between the first drain contact pad 33 and the drain terminal 13 are provided by means of electrical connection clips 20.

As mentioned in the previous embodiments, the connection between the first gate contact pad 31 and the source terminal 12 can be provided by means of an electrical connection clip 20 between the structural plate 14 of the housing 10 and the first gate contact pad 31, the source terminal 12 being electrically connected to the structural plate 14.

The connection between the additional contact pad 331 and the gate terminal 11 can be provided by means of a wire connection or an electrical connection clip 20.

According to this third embodiment of the disclosure, an integrated circuit 100 is obtained, the first chip 30 and second chip 40 of which are connected in a cascode arrangement and wherein the parasitic resistances and inductances linked to the electrical connections between the various components and elements of the integrated circuit 100 are greatly reduced compared to state-of-the-art solutions. A connection between the rear side 45 of the second chip 40 and the front side 34 of the first chip 30 is also eliminated, since all the second contact pads of the second chip 40 (on the front side 44) are in direct contact with the contact pads on the front side 34 of the first chip 30, which significantly reduces the conduction path and, therefore, the associated inductances and parasitic resistances.

According to a fourth embodiment of the disclosure, the housing 10 includes at least four electrical terminals, a gate terminal 11, a source terminal 12, a drain terminal 13 and an additional gate terminal 111.

Figure 6A:
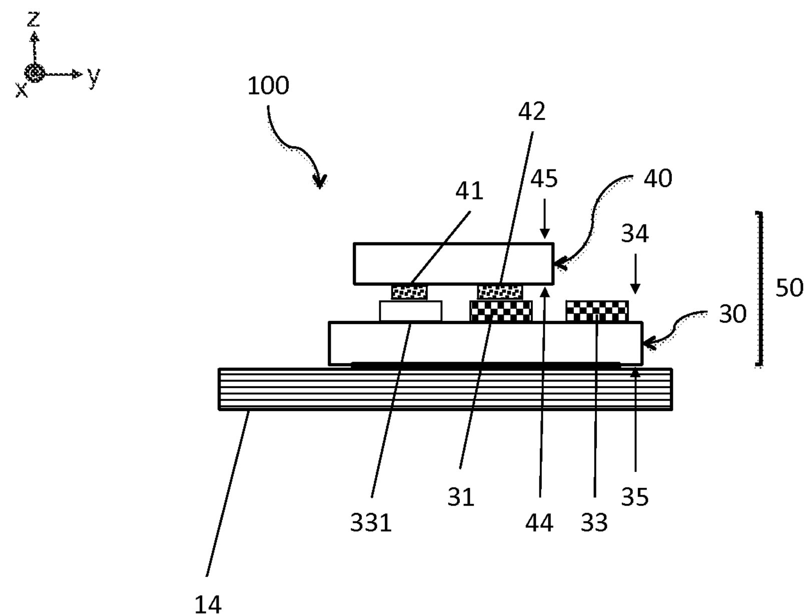
FIGS. 6*a* and 6*b* respectively show a cross-sectional view and a plan view of an integrated circuit according to a fourth embodiment of the disclosure.
Figure 6B:
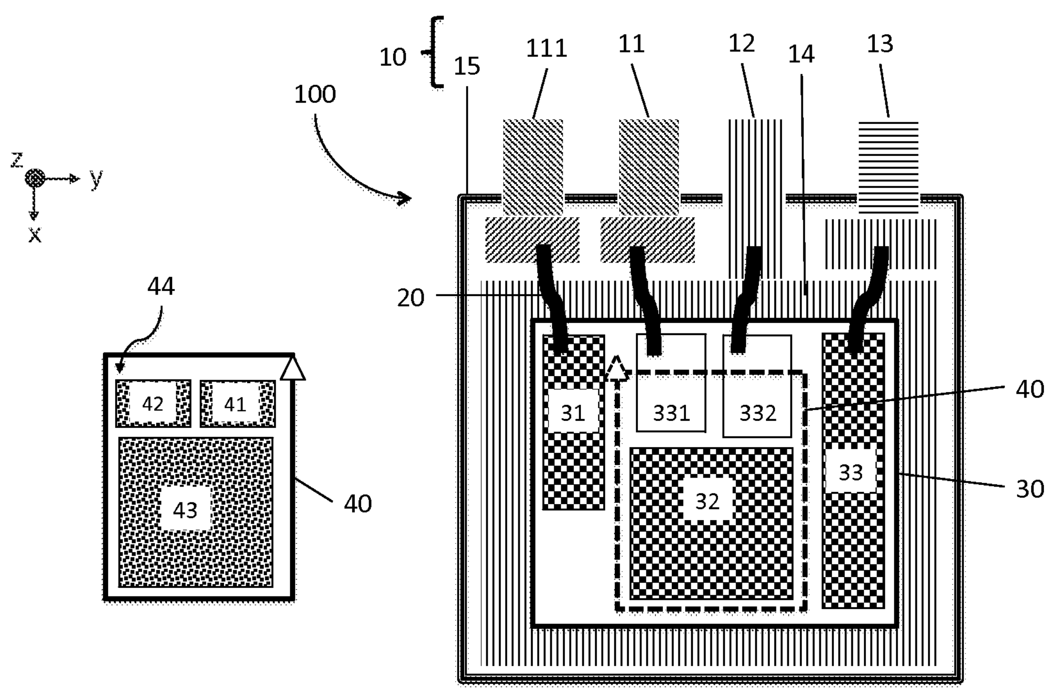

The stack 50 of the integrated circuit 100 is as shown in FIGS. 6*a* and 6*b*. The second gate 41, source 42 and drain 43 contact pads are located on the front side 44 of the second chip 40 (FIG. 6*b*)

Advantageously, the first chip 30 comprises a supplementary additional contact pad 332 located on its front side 34, electrically insulated from the high voltage depletion-mode transistor, and at least partially extending into the peripheral portion of the first chip 30. The first source contact pad 32 extends over the active transistor region of the first chip 30 and forms the main assembly surface between the first chip 30 and the second chip 40. The second drain contact pad 43 also has an extended surface on the front side 44 of the second chip 40, which will make contact with the first source contact pad 32.

Advantageously, the second source contact pad 42, on the front side of the second chip 40, is in contact with the supplementary additional contact pad 332 of the first chip 30.

Finally, the additional contact pad 331, the supplementary additional contact pad 332, the first drain contact pad 33 and the first gate contact pad 31 are connected to the gate terminal 11, the source terminal 12, the drain terminal 13 and the additional gate terminal 111, respectively.

Preferably, at least the connection between the supplementary additional contact pad 332 and the source terminal 12, and the connection between the first drain contact pad 33 and the drain terminal 13 are provided by means of electrical connection clips 20. Alternatively, the connection between the supplementary additional contact pad 332 and the source terminal 12 can be provided by means of an electrical connection clip 20 between the structural plate 14 of the housing 10 and the supplementary additional contact pad 332, the source terminal 12 being electrically connected to the structural plate 14.

The connection between the additional contact pad 331 and the gate terminal 11, and the connection between the first gate contact pad 31 and the additional gate terminal 111 are provided by means of wire connections or electrical connection clips 20.

According to this fourth embodiment of the disclosure, an integrated circuit 100, the first 30 and second 40 chips of which are connected in a cascade arrangement, is obtained: the gate of the high-voltage depletion-mode transistor of the first chip 30 (connected to the additional gate terminal 111) can be controlled independently of the gate of the enhancement mode device of the second chip 40 (connected to the gate terminal 11).

The parasitic resistances and inductances associated with the electrical connections between the various components and elements of the integrated circuit 100 are again significantly reduced compared to state-of-the-art solutions, due to the greatly reduced connection paths and the preferential use of electrical connection clips instead of wire connections on the current paths of the integrated circuit 100.

In the integrated circuit 100 according to the different embodiments of the disclosure, the enhancement mode device included in the second chip 40 may include an enhancement mode transistor, the gate electrode of which is connected to the second gate contact pad 41 of the second chip 40. The gate terminal 11 of the housing 10, connected to the second gate contact pad 41, then transmits an electrical signal to control the gate of the enhancement mode transistor (for example, a MOSFET on silicon).

Alternatively, the enhancement mode device included in the second chip 40 may include an enhancement mode transistor and a control component: in this case, a gate electrode of the enhancement mode transistor is connected to an input of the control component and an output of the control component is connected to the second gate contact pad 41 of the second chip 40. The gate terminal 11 of the housing 10, connected to the second gate contact pad 41, makes it possible here to send an electrical signal to the control component; the latter is then able to process this signal to control the gate of the enhancement-mode transistor.

Of course, the disclosure is not limited to the embodiments described and alternative embodiments can be provided within the scope of the disclosure as defined by the claims.

The invention claimed is:

1. An integrated circuit, comprising:

a first chip including a high-voltage depletion-mode transistor, the first chip having, on a front side thereof, a first gate and first source and drain contact pads; and a second chip including an enhancement-mode device, the second chip having, on a front side thereof, a second gate and second source and drain contact pads; wherein:

the first chip and the second chip are joined to each other at their respective front sides and form a stack, the surface of the front side of the first chip being larger than that of the second chip so that a peripheral portion of the front side of the first chip is not masked by the second chip, the first chip includes at least one additional contact pad on its front side, the at least one additional contact pad being electrically insulated from the high voltage depletion-mode transistor, the at least one additional contact pad being in contact with the second gate contact pad, the first gate contact pad being in contact with the second source contact pad and/or the first source contact pad being in contact with the second drain contact pad, and the first gate contact pad and the at least one additional contact pad extend at least partially into the peripheral portion of the first chip.

2. The integrated circuit of claim 1, further comprising a housing having at least three electrical terminals including a gate terminal, a source terminal and a drain terminal, and wherein a rear side of the first chip is placed on a structural plate of the housing connected to the source terminal.

3. The integrated circuit of claim 2, wherein the first gate contact pad is in contact with the second source contact pad, and the first gate contact pad extends over an active region of the transistor of the first chip and forms a main assembly surface between the first chip and the second chip.

4. The integrated circuit of claim 3, wherein the second drain contact pad is on a rear side of the second chip, the second drain contact pad is connected to the first source contact pad by an electrical connection clip, and the first source contact pad is located in the peripheral portion.

5. The integrated circuit of claim 2, wherein the first source contact pad, is in contact with the second drain contact pad, the first source contact pad extends over an active region of the transistor of the first chip, and the first source contact pad forms a main assembly surface between the first chip and the second chip.

6. The integrated circuit of claim 5, wherein the second source contact pad is on a rear side of the second chip, and the second source contact pad is connected to the first gate contact pad by an electrical connection clip.

7. The integrated circuit of claim 5, wherein the second source contact pad is on the front side of the second chip, and the second source contact pad is in contact with the first gate contact pad.

8. The integrated circuit of claim 4, wherein the at least one additional contact pad, the first gate contact pad and the first drain contact pad are connected to the gate terminal, the source terminal and the drain terminal respectively.

9. The integrated circuit of claim 8, wherein at least the connection between the first gate contact pad and the source terminal, and the connection between the first drain contact pad and the drain terminal are provided by electrical connection clips.

10. The integrated circuit of claim 9, wherein the connection between the first gate contact pad and the source terminal is provided by an electrical connection clip between the structural plate of the housing and the first gate contact pad, and the source terminal is electrically connected to the structural plate.

11. The integrated circuit of claim 8, wherein the connection between the additional contact pad and the gate terminal is provided by a wire connection or an electrical connection clip.

12. The integrated circuit of claim 1, further comprising a housing having at least four electrical terminals including a gate terminal, a source terminal, a drain terminal and an additional gate terminal, and wherein a rear side of the first chip is placed on a structural plate of the housing connected to the source terminal.

13. The integrated circuit of claim 12, wherein the first chip has a supplementary additional contact pad on its front side, the supplementary additional contact pad being electrically insulated from the high voltage depletion-mode transistor, the supplementary additional contact pad extending at least partially in the peripheral portion of the first chip.

14. The integrated circuit of claim 13, wherein the first source contact pad is in contact with the second drain contact pad, and the first source contact pad extends over an active region of the transistor of the first chip and forms a main assembly surface between the first chip and the second chip.

15. The integrated circuit of claim 13, wherein the second source contact pad is on the front side of the second chip, and is in contact with the supplementary additional contact pad.

16. The integrated circuit of claim 15, wherein the additional contact pad, the supplementary additional contact pad, the first drain contact pad and the first gate contact pad are respectively connected to the gate terminal, the source terminal, the drain terminal and the additional gate terminal.

17. The integrated circuit of claim 16, wherein at least the connection between the supplementary additional contact pad and the source terminal and the connection between the first drain contact pad and the drain terminal are provided by electrical connection clips.

18. The integrated circuit of claim 17, wherein the connection between the supplementary additional contact pad and the source terminal is provided by an electrical connection clip between the structural plate of the housing and the supplementary additional contact pad, and the source terminal is electrically connected to the structural plate.

19. The integrated circuit of claim 16, wherein the connection between the additional contact pad and the gate terminal and the connection between the first gate contact pad and the additional gate terminal are provided by wire connections or electrical connection clips.

20. The integrated circuit of claim 1, wherein the enhancement-mode device of the second chip comprises an enhancement-mode transistor and a gate electrode, is the gate electrode of the enhancement-mode device being connected to the gate contact pad of the second chip.

21. The integrated circuit of claim 1, wherein the enhancement-mode device of the second chip comprises an enhancement-mode transistor and a control component, a gate electrode of the enhancement-mode transistor being connected to an input of the control component, and an output of the control component being connected to the gate contact pad of the second chip.

* * * * *